United States Patent
Moore et al.

(10) Patent No.: US 11,318,663 B2
(45) Date of Patent: May 3, 2022

(54) MULTI-LAYER STAMP

(71) Applicant: X Display Company Technology Limited, Dublin (IE)

(72) Inventors: Tanya Yvette Moore, Hurdle Mills, NC (US); Ronald S. Cok, Rochester, NY (US); David Gomez, Holly Springs, NC (US)

(73) Assignee: X Display Company Technology Limited, Dublin (IE)

( * ) Notice: Subject to any disclaimer, the term of this patent is extended or adjusted under 35 U.S.C. 154(b) by 20 days.

(21) Appl. No.: 17/125,037

(22) Filed: Dec. 17, 2020

(65) Prior Publication Data

US 2021/0101329 A1 Apr. 8, 2021

Related U.S. Application Data

(62) Division of application No. 14/975,041, filed on Dec. 18, 2015, now Pat. No. 10,899,067.

(51) Int. Cl.
*B29C 33/38* (2006.01)
*B29C 59/02* (2006.01)
(Continued)

(52) U.S. Cl.
CPC ........ *B29C 59/026* (2013.01); *B29C 33/3842* (2013.01); *B29C 59/002* (2013.01);
(Continued)

(58) Field of Classification Search
CPC .................................................. B29C 33/3842
See application file for complete search history.

(56) References Cited

U.S. PATENT DOCUMENTS

| | | | |
|---|---|---|---|
| 4,934,267 A | 6/1990 | Hashimoto et al. | |
| 5,205,032 A | 4/1993 | Kuroda et al. | |

(Continued)

FOREIGN PATENT DOCUMENTS

| | | | |
|---|---|---|---|
| EP | 0281100 B1 | 6/1992 | |
| JP | H11-142878 A | 5/1999 | |

(Continued)

OTHER PUBLICATIONS

Bietsch, A. and Michel, B., Conformal contact and pattern stability of stamps used for soft lithography, J. Appl. Phys., 88(7):4310-4318, (2000).

(Continued)

*Primary Examiner* — Joseph S Del Sole
*Assistant Examiner* — Manley L Cummins, IV
(74) *Attorney, Agent, or Firm* — Choate, Hall & Stewart LLP; Michael D. Schmitt

(57) ABSTRACT

A stamp for micro-transfer printing includes a support having a support stiffness and a support coefficient of thermal expansion (CTE). A pedestal layer is formed on the support, the pedestal layer having a pedestal layer stiffness that is less than the support stiffness and a pedestal layer coefficient of thermal expansion (CTE) that is different from the support coefficient of thermal expansion (CTE). A stamp layer is formed on the pedestal layer, the stamp layer having a body and one or more protrusions extending from the body in a direction away from the pedestal layer. The stamp layer has a stamp layer stiffness that is less than the support stiffness and a stamp layer coefficient of thermal expansion that is different from the support coefficient of thermal expansion.

20 Claims, 9 Drawing Sheets

(51) Int. Cl.
*H01L 23/00* (2006.01)
*H01L 21/683* (2006.01)
*B41F 17/00* (2006.01)
*B29C 59/00* (2006.01)
*B29L 31/34* (2006.01)
*B41F 16/00* (2006.01)
*B29L 7/00* (2006.01)

(52) U.S. Cl.
CPC .............. *B29C 59/02* (2013.01); *B41F 17/00* (2013.01); *H01L 21/6835* (2013.01); *H01L 24/75* (2013.01); *H01L 24/81* (2013.01); *H01L 24/95* (2013.01); *B29C 2059/023* (2013.01); *B29C 2059/028* (2013.01); *B29L 2007/001* (2013.01); *B29L 2031/34* (2013.01); *B41F 16/00* (2013.01); *H01L 2224/81005* (2013.01); *H01L 2224/81345* (2013.01); *H01L 2224/81901* (2013.01); *H01L 2224/81986* (2013.01)

(56) References Cited

U.S. PATENT DOCUMENTS

| | | | |
|---|---|---|---|
| 5,265,533 | A | 11/1993 | Svantesson et al. |
| 5,550,066 | A | 8/1996 | Tang et al. |
| 5,621,555 | A | 4/1997 | Park |
| 5,815,303 | A | 9/1998 | Berlin |
| 5,882,532 | A | 3/1999 | Field et al. |
| 5,900,160 | A | 5/1999 | Whitesides et al. |
| 6,025,730 | A | 2/2000 | Akram et al. |
| 6,142,358 | A | 11/2000 | Cohn et al. |
| 6,180,239 | B1 | 1/2001 | Whitesides et al. |
| 6,278,242 | B1 | 8/2001 | Cok et al. |
| 6,387,778 | B1 | 5/2002 | Bonin et al. |
| 6,555,408 | B1 | 4/2003 | Jacobsen et al. |
| 6,577,367 | B2 | 6/2003 | Kim |
| 6,717,560 | B2 | 4/2004 | Cok et al. |
| 6,756,576 | B1 | 6/2004 | McElroy et al. |
| 6,933,532 | B2 | 8/2005 | Arnold et al. |
| 6,969,624 | B2 | 11/2005 | Iwafuchi et al. |
| 6,974,711 | B2 | 12/2005 | Yanagisawa et al. |
| 6,998,644 | B1 | 2/2006 | Boling et al. |
| 7,127,810 | B2 | 10/2006 | Kasuga et al. |
| 7,129,457 | B2 | 10/2006 | McElroy et al. |
| 7,195,733 | B2 | 3/2007 | Rogers et al. |
| 7,259,391 | B2 | 8/2007 | Liu et al. |
| 7,288,753 | B2 | 10/2007 | Cok |
| 7,354,801 | B2 | 4/2008 | Sugiyama et al. |
| 7,434,512 | B2 | 10/2008 | Bietsch et al. |
| 7,479,318 | B2 | 1/2009 | Jagota et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,605,053 | B2 | 10/2009 | Couillard et al. |
| 7,622,367 | B1 | 11/2009 | Nuzzo et al. |
| 7,662,545 | B2 | 2/2010 | Nuzzo et al. |
| 7,691,656 | B2 | 4/2010 | Bader et al. |
| 7,704,684 | B2 | 4/2010 | Rogers et al. |
| 7,799,699 | B2 | 9/2010 | Nuzzo et al. |
| 7,816,856 | B2 | 10/2010 | Cok et al. |
| 7,875,313 | B2 | 1/2011 | Blanchet et al. |
| 7,893,612 | B2 | 2/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 7,982,296 | B2 | 7/2011 | Nuzzo et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,110,425 | B2 | 2/2012 | Yun |
| 8,142,700 | B2 | 3/2012 | Sitti et al. |
| 8,198,621 | B2 | 6/2012 | Rogers et al. |
| 8,206,631 | B1 | 6/2012 | Sitti et al. |
| 8,207,547 | B2 | 6/2012 | Lin |
| 8,217,381 | B2 | 7/2012 | Rogers et al. |
| 8,261,660 | B2 | 9/2012 | Menard |
| 8,333,860 | B1 | 12/2012 | Bibl et al. |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,470,701 | B2 | 6/2013 | Rogers et al. |
| 8,480,942 | B2 | 7/2013 | Shannon et al. |
| 8,502,192 | B2 | 8/2013 | Kwak et al. |
| 8,506,867 | B2 | 8/2013 | Menard |
| 8,524,092 | B2 | 9/2013 | Sitti et al. |
| 8,558,243 | B2 | 10/2013 | Bibl et al. |
| 8,664,699 | B2 | 3/2014 | Nuzzo et al. |
| 8,679,888 | B2 | 3/2014 | Rogers et al. |
| 8,685,764 | B2 | 4/2014 | Chu et al. |
| 8,686,447 | B2 | 4/2014 | Tomoda et al. |
| 8,703,032 | B2 | 4/2014 | Menon et al. |
| 8,722,458 | B2 | 5/2014 | Rogers et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,835,940 | B2 | 9/2014 | Hu et al. |
| 8,854,294 | B2 | 10/2014 | Sakariya |
| 8,865,489 | B2 | 10/2014 | Rogers et al. |
| 8,871,547 | B2 | 10/2014 | Chu et al. |
| 8,877,648 | B2 | 11/2014 | Bower et al. |
| 8,889,485 | B2 | 11/2014 | Bower |
| 8,895,406 | B2 | 11/2014 | Rogers et al. |
| 8,934,259 | B2 | 1/2015 | Bower et al. |
| 8,941,215 | B2 | 1/2015 | Hu et al. |
| 8,961,855 | B2 | 2/2015 | Ho et al. |
| 8,987,765 | B2 | 3/2015 | Bibl et al. |
| 9,105,714 | B2 | 8/2015 | Hu et al. |
| 9,111,464 | B2 | 8/2015 | Bibl et al. |
| 9,132,605 | B2 | 9/2015 | Nguyen et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,166,114 | B2 | 10/2015 | Hu et al. |
| 9,178,123 | B2 | 11/2015 | Sakariya et al. |
| 9,217,541 | B2 | 12/2015 | Bathurst et al. |
| 9,238,309 | B2 | 1/2016 | King et al. |
| 9,240,397 | B2 | 1/2016 | Bibl et al. |
| 9,252,375 | B2 | 2/2016 | Bibl et al. |
| 9,307,652 | B2 | 4/2016 | Bower |
| 9,358,775 | B2 | 6/2016 | Bower et al. |
| 9,367,094 | B2 | 6/2016 | Bibl et al. |
| 9,368,683 | B1 | 6/2016 | Meitl et al. |
| 9,401,344 | B2 | 7/2016 | Bower et al. |
| 9,412,727 | B2 | 8/2016 | Menard et al. |
| 9,478,583 | B2 | 10/2016 | Hu et al. |
| 9,484,504 | B2 | 11/2016 | Bibl et al. |
| 9,548,332 | B2 | 1/2017 | Hu et al. |
| 9,550,353 | B2 | 1/2017 | Bower et al. |
| 9,555,644 | B2 | 1/2017 | Rogers et al. |
| 9,583,533 | B2 | 2/2017 | Hu et al. |
| 9,589,944 | B2 | 3/2017 | Higginson et al. |
| 9,601,356 | B2 | 3/2017 | Bower et al. |
| 9,626,908 | B2 | 4/2017 | Sakariya et al. |
| 9,640,715 | B2 | 5/2017 | Bower et al. |
| 9,716,082 | B2 | 7/2017 | Bower et al. |
| 9,761,754 | B2 | 9/2017 | Bower et al. |
| 9,765,934 | B2 | 9/2017 | Rogers et al. |
| 9,865,832 | B2 | 1/2018 | Bibl et al. |
| 9,929,053 | B2 | 3/2018 | Bower et al. |
| 10,181,483 | B2 | 1/2019 | Menard et al. |
| 10,189,243 | B2 | 1/2019 | Menard et al. |
| 10,252,514 | B2 | 4/2019 | Bower et al. |
| 2001/0040298 | A1 | 11/2001 | Baba et al. |
| 2002/0050220 | A1 | 5/2002 | Schueller et al. |
| 2002/0158568 | A1 | 10/2002 | Satake |
| 2003/0027083 | A1 | 2/2003 | Fuller et al. |
| 2003/0117369 | A1 | 6/2003 | Spitzer et al. |
| 2003/0141570 | A1 | 7/2003 | Chen et al. |
| 2004/0082163 | A1 | 4/2004 | Mori et al. |

(56) References Cited

U.S. PATENT DOCUMENTS

| | | |
|---|---|---|
| 2004/0121568 A1 | 6/2004 | Kim et al. |
| 2004/0130020 A1 | 7/2004 | Kuwabara et al. |
| 2004/0173876 A1 | 9/2004 | Musalem et al. |
| 2004/0192041 A1 | 9/2004 | Jeong et al. |
| 2004/0227886 A1 | 11/2004 | Kimura |
| 2005/0040754 A1 | 2/2005 | Sakurai |
| 2005/0133241 A1 | 6/2005 | Chi et al. |
| 2005/0170621 A1 | 8/2005 | Kim et al. |
| 2005/0202595 A1 | 9/2005 | Yonehara et al. |
| 2005/0238967 A1* | 10/2005 | Rogers ............ B82Y 10/00 430/5 |
| 2005/0285246 A1 | 12/2005 | Haba et al. |
| 2006/0024974 A1 | 2/2006 | Azuri et al. |
| 2006/0038182 A1 | 2/2006 | Rogers et al. |
| 2006/0051900 A1 | 3/2006 | Shizuno |
| 2006/0063309 A1 | 3/2006 | Sugiyama et al. |
| 2007/0032089 A1 | 2/2007 | Nuzzo et al. |
| 2007/0037318 A1 | 2/2007 | Kim |
| 2007/0080464 A1 | 4/2007 | Goebel et al. |
| 2007/0120681 A1 | 5/2007 | Yamazaki et al. |
| 2007/0254455 A1 | 11/2007 | Yamaguchi et al. |
| 2008/0000375 A1* | 1/2008 | Nielsen ............ B81C 99/009 101/450.1 |
| 2008/0054439 A1 | 3/2008 | Malhan et al. |
| 2008/0055581 A1 | 3/2008 | Rogers et al. |
| 2008/0108171 A1 | 5/2008 | Rogers et al. |
| 2008/0131822 A1 | 6/2008 | Liao et al. |
| 2008/0164575 A1 | 7/2008 | Ikeda et al. |
| 2008/0185705 A1 | 8/2008 | Osborn et al. |
| 2008/0202365 A1 | 8/2008 | Schneider et al. |
| 2008/0268571 A1 | 10/2008 | Kim |
| 2008/0280085 A1 | 11/2008 | Livne |
| 2009/0123590 A1* | 5/2009 | Komoriya ............ B82Y 10/00 425/174.4 |
| 2009/0133914 A1 | 5/2009 | Dellmann et al. |
| 2009/0199960 A1* | 8/2009 | Nuzzo ............ H01L 31/18 156/230 |
| 2010/0002402 A1 | 1/2010 | Rogers et al. |
| 2010/0018420 A1 | 1/2010 | Menard |
| 2010/0021647 A1 | 1/2010 | Sitti et al. |
| 2010/0062098 A1 | 3/2010 | Ando et al. |
| 2010/0072495 A1 | 3/2010 | Yamazaki |
| 2010/0123134 A1 | 5/2010 | Nagata |
| 2010/0123268 A1* | 5/2010 | Menard ............ H01L 24/97 264/293 |
| 2010/0155989 A1* | 6/2010 | Ishii ............ B29C 59/022 264/225 |
| 2010/0190293 A1 | 7/2010 | Maeda et al. |
| 2010/0224317 A1 | 9/2010 | Kawamura |
| 2010/0248484 A1 | 9/2010 | Bower et al. |
| 2010/0265440 A1 | 10/2010 | French et al. |
| 2010/0289115 A1 | 11/2010 | Akiyama et al. |
| 2010/0308008 A1 | 12/2010 | Zhu et al. |
| 2010/0317132 A1 | 12/2010 | Rogers et al. |
| 2011/0120754 A1 | 5/2011 | Kondo et al. |
| 2011/0182805 A1 | 7/2011 | DeSimone et al. |
| 2011/0219973 A1 | 9/2011 | Gullentops et al. |
| 2011/0259223 A1 | 10/2011 | Cau et al. |
| 2011/0266670 A1 | 11/2011 | England et al. |
| 2011/0277813 A1 | 11/2011 | Rogers et al. |
| 2012/0000379 A1 | 1/2012 | Greener et al. |
| 2012/0027557 A1 | 2/2012 | Ashdown et al. |
| 2012/0043130 A1 | 2/2012 | Rathburn |
| 2012/0104624 A1 | 5/2012 | Choi et al. |
| 2012/0115262 A1 | 5/2012 | Menard et al. |
| 2012/0126229 A1 | 5/2012 | Bower |
| 2012/0168776 A1 | 7/2012 | Nakamura et al. |
| 2012/0228669 A1 | 9/2012 | Bower et al. |
| 2012/0256346 A1 | 10/2012 | Ogino et al. |
| 2012/0313241 A1 | 12/2012 | Bower |
| 2012/0314388 A1 | 12/2012 | Bower et al. |
| 2012/0321738 A1 | 12/2012 | Ishii et al. |
| 2012/0328728 A1 | 12/2012 | Nakatsuka et al. |
| 2013/0068720 A1 | 3/2013 | Taniguchi |
| 2013/0069275 A1* | 3/2013 | Menard ............ B32B 37/16 264/293 |
| 2013/0078576 A1 | 3/2013 | Wu et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0333094 A1 | 12/2013 | Rogers et al. |
| 2013/0337608 A1 | 12/2013 | Kotani et al. |
| 2014/0084450 A1 | 3/2014 | Nielson et al. |
| 2014/0094878 A1 | 4/2014 | Gossler et al. |
| 2014/0104243 A1 | 4/2014 | Sakariya et al. |
| 2014/0159043 A1 | 6/2014 | Sakariya et al. |
| 2014/0159064 A1 | 6/2014 | Sakariya et al. |
| 2014/0264763 A1 | 9/2014 | Meitl et al. |
| 2014/0267683 A1 | 9/2014 | Bibl et al. |
| 2014/0327132 A1 | 11/2014 | Zhang et al. |
| 2014/0367633 A1 | 12/2014 | Bibl et al. |
| 2015/0135525 A1 | 5/2015 | Bower |
| 2015/0137153 A1 | 5/2015 | Bibl et al. |
| 2015/0163906 A1 | 6/2015 | Bower et al. |
| 2015/0169011 A1 | 6/2015 | Bibl et al. |
| 2015/0348926 A1 | 12/2015 | Bower |
| 2015/0371874 A1 | 12/2015 | Bower et al. |
| 2016/0016399 A1 | 1/2016 | Bower et al. |
| 2016/0020120 A1 | 1/2016 | Bower et al. |
| 2016/0020127 A1 | 1/2016 | Bower et al. |
| 2016/0020130 A1 | 1/2016 | Bower et al. |
| 2016/0020131 A1 | 1/2016 | Bower et al. |
| 2016/0020187 A1 | 1/2016 | Okada et al. |
| 2017/0047303 A1 | 2/2017 | Meitl et al. |
| 2017/0047306 A1 | 2/2017 | Meitl et al. |
| 2017/0103964 A1 | 4/2017 | Bower et al. |
| 2017/0133248 A1 | 5/2017 | Menard et al. |
| 2017/0133250 A1 | 5/2017 | Menard et al. |
| 2017/0154819 A1 | 6/2017 | Bower et al. |
| 2017/0206845 A1 | 7/2017 | Sakariya et al. |
| 2017/0207193 A1 | 7/2017 | Bower et al. |
| 2017/0256521 A1 | 9/2017 | Cok et al. |
| 2017/0338374 A1 | 11/2017 | Zou et al. |
| 2018/0001614 A1 | 1/2018 | Bower et al. |

FOREIGN PATENT DOCUMENTS

| | | |
|---|---|---|
| JP | 2005099410 A | 4/2005 |
| TW | 200707688 A | 2/2007 |
| WO | WO-2005/088704 A1 | 9/2005 |
| WO | WO-2007/037106 A1 | 4/2007 |
| WO | WO-2008/103931 A2 | 8/2008 |
| WO | WO-2008/143635 A1 | 11/2008 |
| WO | WO-2011/126726 A1 | 10/2011 |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Foest, R. et al., Kalte Normaldruck-Jetplasmen zur lokalen Oberflächenbehandlung, Vakuum in Forschung und Praxis, 21(6):17-21, (2009).

Hamer et al., 63.2: AMOLED Displays Using Transfer-Printed Integrated Circuits, SID 09 DIGEST, 40(2):947-950 (2009).

Howlader, M. M. R. et al., Nanobonding Technology Toward Electronic, Fluidic, and Photonic Systems Integration, IEEE, Jour-

(56) References Cited

OTHER PUBLICATIONS nal of Selected Topics in Quantum Electronics, 17(3):689-703, (2011).

Hui, C. Y. et al., Constraints on Microcontact Printing Imposed by Stamp Deformation, Langmuir, 18:1394-1407 (2002).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Murphy, M.P. et al., Enhanced Adhesion by Gecko-Inspired Hierarchical Fibrillar Adhesives, Applied Materials & Interfaces, 1(4):849-855, (2009).

Roscher, H., VCSEL Arrays with Redundant Pixel Designs for 10Gbits/s 2-D Space-Parallel MMF Transmission, Annual Report, optoelectronics Department, (2005).

Schmid, H. and Michel, B., Siloxane Polymers for High-Resolution, High-Accuracy Soft Lithography, Macromolecules 2000, 33:3042-3049, (2000).

Trindade, A.J. et al., Precision transfer printing of ultra-thin AlInGaN micron-size light-emitting diodes, Crown, pp. 217-218, (2012).

Wu-Bavouzet, F. et al., Effect of surface pattern on the adhesive friction of elastomers, Physical Review E, 82(3):031806-1-031806-9 (2010).

Yaniv et al., A 640 x 480 Pixel Computer Display Using Pin Diodes with Device Redundancy, 1988 International Display Research Conference, IEEE, CH-2678-1/88:152-154 (1988).

Zhou, W. et al., Mechanism for stamp collapse in soft lithography, Applied Physics Letters, 87:251925-1 (2005).

\* cited by examiner

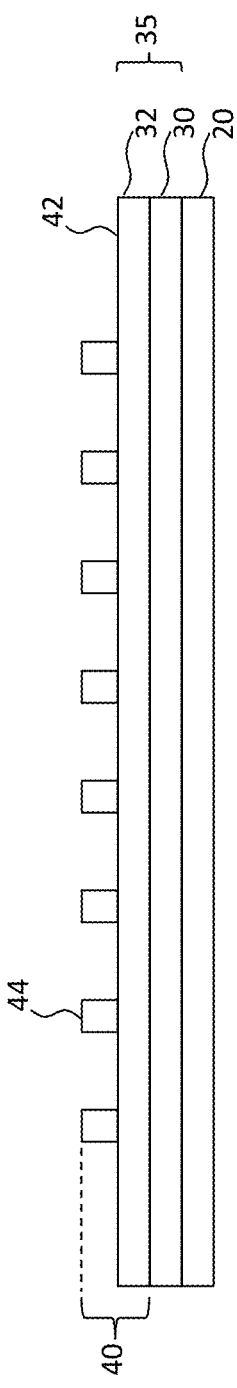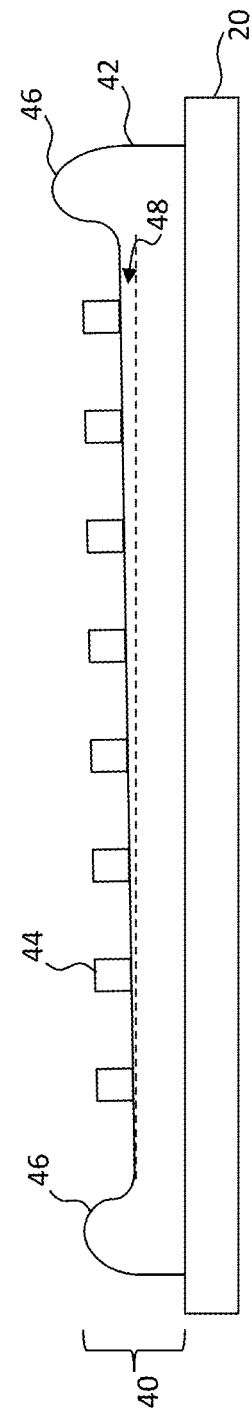

MULTI-LAYER STAMP

PRIORITY APPLICATION

This application is a division of U.S. patent application Ser. No. 14/975,041, filed on Dec. 18, 2015, now U.S. Pat. No. 10,899,067, the content of which is incorporated by reference herein in its entirety.

CROSS REFERENCE TO RELATED APPLICATION

This application is related to U.S. patent application Ser. No. 14/804,031 filed Jul. 20, 2015, entitled Apparatus and Methods for Micro-Transfer-Printing, and to U.S. patent application Ser. No. 14/918,174 filed Oct. 20, 2015, entitled Stamp with Structured Posts, which are hereby incorporated by reference in their entirety.

FIELD OF THE INVENTION

The present invention relates to stamps used in micro transfer printing.

BACKGROUND OF THE INVENTION

The disclosed technology relates generally to methods and tools for micro-transfer-printing. Conventional methods such as pick-and-place for applying integrated circuits to a destination substrate are limited to relatively large devices, for example having a dimension of a millimeter or more and it is often difficult to pick up and place ultra-thin, fragile, or small devices using such conventional technologies. More recently, micro-transfer printing methods have been developed that permit the selection and application of these ultra-thin, fragile, or small devices without causing damage to the devices themselves.

Micro-transfer printing enables deterministically removing arrays of micro-scale, high-performance devices from a native source wafer, typically a semiconductor wafer on which the devices are constructed, and assembling and integrating the devices onto non-native destination substrates. In its simplest embodiment, micro-transfer printing is analogous to using a rubber stamp to transfer liquid-based inks from an ink-pad onto paper. However, in micro-transfer printing the "inks" are composed of high-performance solid-state semiconductor devices and the "paper" can be substrates, including glass, plastics, ceramics, metals, or other semiconductors. The micro-transfer printing process leverages engineered elastomer stamps coupled with high-precision motion-controlled print-heads to selectively pick up and print large arrays of micro-scale devices from a source native wafer onto non-native destination substrates.

Adhesion between the elastomer transfer device and the printable element can be selectively tuned by varying the speed of the print-head. This rate-dependent adhesion is a consequence of the viscoelastic nature of the elastomer used to construct the transfer device. When the transfer device is moved quickly away from a bonded interface, the adhesion is large enough to "pick" the printable elements away from their native substrates, and conversely, when the transfer device is moved slowly away from a bonded interface the adhesion is low enough to "let go" or "print" the element onto a foreign surface. This process may be performed in massively parallel operations in which the stamps can transfer, for example, hundreds to thousands of discrete structures in a single pick-up and print operation.

Micro-transfer printing enables parallel assembly of high-performance semiconductor devices onto virtually any substrate material, including glass, plastics, metals, ceramics, or semiconductors. The substrates may be flexible, thereby permitting the production of flexible electronic devices. Flexible substrates may be integrated in a large number of configurations, including configurations not possible with brittle silicon-based electronic devices. Additionally, plastic substrates, for example, are mechanically rugged and may be used to provide electronic devices that are less susceptible to damage or electronic performance degradation caused by mechanical stress. Thus, these materials may be used to fabricate electronic devices by continuous, high-speed, printing techniques capable of generating electronic devices over large substrate areas at low cost (e.g., roll-to-roll manufacturing).

Moreover, micro-transfer printing techniques can print semiconductor devices at temperatures compatible with assembly on plastic polymer substrates. In addition, semiconductor materials may be printed onto large areas of substrates thereby enabling continuous, high-speed printing of complex integrated electrical circuits over large substrate areas. Fully flexible electronic devices with good electronic performance in flexed or deformed device orientations can be provided to enable a wide range of flexible electronic devices.

Micro-structured stamps may be used to pick up micro devices from a source substrate, transport the micro devices to the destination, and print the micro devices onto a destination substrate. The transfer device (e.g., micro-structured stamp) can be created using various materials. Posts on the transfer device can be generated such that they pick up material from a pick-able object and then print the material to the target substrate. The posts can be generated in an array fashion and can have a range of heights depending on the size of the printable material. For effective, high-yield printing, when picking up the material it is important that the stamp posts are in close contact with the material (e.g., micro integrated circuits) being transferred or printed.

There is a need, therefore, for stamps having an improved ability to pick up and transfer material over the extent of a source substrate.

SUMMARY OF THE INVENTION

The present invention provides structures and methods that enable micro-transfer printing for micro-devices on a substrate, especially substrates such with an extensive surface as a wafer, for example having a dimension (for example a diameter) greater than or equal to 10 cm, 15 cm, 20 cm, 25 cm, 30 cm, 40 cm, or even larger. The micro-devices are formed on a source substrate, contacted by a stamp to release them from the source substrate and adhere the micro-devices to the stamp, and pressed against a destination substrate to adhere the micro-devices to the destination substrate. The stamp is then moved away from the destination substrate, leaving the micro-devices on the destination substrate.

Such printed structures enable low-cost, high-performance arrays of electrically connected micro-devices such as integrated circuits or micro-light-emitting diodes (LEDs) useful, for example, in display systems. For example, described herein are micro assembled arrays of micro devices, such as integrated circuits or micro-LEDs, that are too small (e.g., with a width, length, height, or diameter of 0.5 μm to 50 μm such as a width of 1-8 μm, a length of 5-10 μm or a height of 0.5-3 μm), numerous, or fragile to be assembled by conventional means. Rather, these arrays are assembled using micro-transfer printing technology. The micro-devices may be prepared on a native source substrate and printed to a destination substrate (e.g., plastic, metal, glass, ceramic, sapphire, transparent materials, opaque materials, rigid materials, or flexible materials), thereby obviating the manufacture of the micro-devices on the destination substrate.

In certain embodiments, a stamp for micro-transfer printing includes a support, an intermediate pedestal layer, and a stamp layer having a body and protrusions, for example posts, extending a distance from the support. The support has a different coefficient of thermal expansion (CTEs) and a different stiffness than either the stamp layer or the pedestal layer. In an embodiment, the pedestal layer and stamp layer are made of the same material and have the same CTE and stiffness. In other embodiments, the pedestal layer and stamp layer include the same material in different proportions, are made of different materials, have different CTEs, or a different stiffness. The pedestal layer and stamp body can have the same thickness or different thickness. In an embodiment, the pedestal layer is thicker than the stamp body, is stiffer than the stamp layer, or has a smaller CTE than the stamp layer.

In certain embodiments, the pedestal layer and the stamp layer extend over the support and the stamp layer extends a smaller distance over the support than the pedestal layer.

In another embodiment, the pedestal layer is a first pedestal layer and a second pedestal layer is formed between the first pedestal layer and the stamp layer. In an embodiment, the first pedestal layer and the second pedestal layer are the same material, have the same thickness, and have the same CTE and stiffness. In another embodiment, the first pedestal layer and the second pedestal layer include the same materials in different proportions or include different materials, the first pedestal layer is thicker than the second pedestal layer, is stiffer than the second pedestal layer, or has a smaller CTE than the second pedestal layer. The second pedestal layer can extend a smaller distance over the support than the first pedestal layer and the stamp layer can extend a smaller distance over the support than the second pedestal layer.

In certain embodiments the pedestal layer is substantially flat and does not include micro-structures for picking up material from a source substrate. In other embodiments, the pedestal layer is flat at least in the region in which the stamp layer is formed or can have a stacked structure, for example a stack structure of concentric cylinders or rectangular solids of the same or different thicknesses.

In certain embodiments, the stamp layer extends over the support for an extent and a ratio of the difference between the distance and a predetermined desired distance and the extent is less than 30 μm in 50 mm, less than or equal to 20 μm in in 50 mm, less than or equal to 15 μm in 50 mm, less than or equal to 10 μm in 50 mm, less than or equal to 7.5 μm in 50 mm, or less than or equal to 5 μm in 50 mm.

In an embodiment of the present invention, a method of making a stamp for micro-transfer printing includes providing a support having a support stiffness and a support coefficient of thermal expansion (CTE), forming a liquid pedestal layer on the support and curing the liquid pedestal layer to form a cured pedestal layer, the pedestal layer having a pedestal layer stiffness that is less than the support stiffness and a pedestal layer coefficient of thermal expansion that is different from the support coefficient of thermal expansion. A liquid stamp layer is formed and cured on the cured pedestal layer, to form a cured stamp layer, the stamp layer having a body and one or more protrusions extending from the body in a direction away from the pedestal layer. The stamp layer has a stamp layer stiffness that is less than the support stiffness and a stamp layer coefficient of thermal expansion (CTE) that is different from the support coefficient of thermal expansion (CTE). In a further embodiment, the pedestal layer is a first pedestal layer and a second pedestal layer is formed on the first pedestal layer using similar methods. The stamp layer is formed on the second pedestal layer.

Micro-structured stamps (e.g., elastomeric, electrostatic stamps, or hybrid elastomeric/electrostatic stamps) can be used to pick up the disclosed micro devices, transport the micro devices to the destination, and print the micro devices onto a destination substrate. In some embodiments, surface adhesion forces are used to control the selection and printing of these devices onto the destination substrate. This process may be performed massively in parallel. The stamps can be designed to transfer a single device or hundreds to thousands of discrete structures in a single pick-up and print operation. For a discussion of micro transfer printing generally, see U.S. Pat. Nos. 7,622,367 and 8,506,867, each of which is hereby incorporated by reference in its entirety.

Moreover, these micro transfer printing techniques can be used to print semiconductor devices at temperatures compatible with assembly on plastic polymer substrates. In addition, semiconductor materials may be printed onto large areas of substrates thereby enabling continuous, high speed printing of complex integrated electrical circuits over large substrate areas.

Furthermore, fully flexible electronic devices with good electronic performance in flexed or deformed device orientations can be provided to enable a wide range of flexible electronic devices. The destination substrate may be flexible, thereby permitting the production of flexible electronic devices. Flexible substrates may be integrated in a large number of configurations, including configurations not possible with brittle silicon-based electronic devices. Additionally, plastic substrates, for example, are mechanically rugged and may be used to provide electronic devices that are less susceptible to damage and/or electronic performance degradation caused by mechanical stress. Thus, these materials may be used to fabricate electronic devices by continuous, high speed, printing techniques capable of generating electronic devices over large substrate areas at low cost (e.g., using roll-to-roll manufacturing).

It can be desirable to transfer as many devices with a micro-transfer printing stamp as possible and it is therefore desirable to use a stamp that is large and has many posts. However, as structures become larger, it is increasingly difficult to make them with fine precision. It is an advantage of the present invention that larger micro-transfer printing stamps with more posts are made with improved precision and flat surfaces suitable for micro-transfer printing from relatively larger substrates, such as semiconductor substrates. This is accomplished by providing one or more intermediate pedestal layers between the stamp posts and the support. The cured intermediate pedestal layers provide increasing flatness over the support so that the distal ends of the stamp posts across the extent of the stamp are more closely aligned in a plane.

In another embodiment of the present invention, the stamp for micro-transfer printing of the present invention is made by a process of the present invention and used for micro transfer printing by pressing the non-planar surface at the distal end of one of the one or more posts against the non-planar contact surface of the micro-transfer printable device to adhere the micro-transfer printable device to the distal end of the one post, removing the micro-transfer printable device from the wafer with the stamp, pressing the micro-transfer printable device to a destination substrate with the stamp to adhere the micro-transfer printable device to the destination substrate, and removing the stamp from the micro-transfer printable device and the destination substrate.

In one aspect, the disclosed technology includes a stamp for micro-transfer printing, including: a support having a support stiffness and a support coefficient of thermal expansion (CTE); a pedestal layer formed on the support, the pedestal layer having a pedestal layer stiffness that is less than the support stiffness and a pedestal layer coefficient of thermal expansion (CTE) that is different from the support coefficient of thermal expansion (CTE); and a stamp layer formed on the pedestal layer, the stamp layer having a body and one or more protrusions extending from the body in a direction away from the pedestal layer, the stamp layer having a stamp layer stiffness that is less than the support stiffness and a stamp layer coefficient of thermal expansion that is different from the support coefficient of thermal expansion.

In certain embodiments, the pedestal layer is made of the same material as the stamp layer or wherein the pedestal layer comprises the same materials as the stamp layer but in different proportions.

In certain embodiments, at least one of the pedestal layer and the stamp layer is polydimethylsiloxane (PDMS).

In certain embodiments, the support is glass, metal, or ceramic.

In certain embodiments, the pedestal layer stiffness is greater than the stamp layer stiffness or wherein the pedestal layer stiffness is between the stamp layer stiffness and the support stiffness.

In certain embodiments, the pedestal layer stiffness is less than or substantially equal to the stamp layer stiffness.

In certain embodiments, the thickness of the pedestal layer is greater than the thickness of the stamp layer body.

In certain embodiments, the thickness of the pedestal layer is less than or substantially equal to the thickness of the stamp layer body.

In certain embodiments, the pedestal layer CTE is greater than the stamp layer CTE or wherein the pedestal layer CTE is between the stamp layer CTE and the support layer CTE.

In certain embodiments, the pedestal layer CTE is less than or substantially equal to the stamp layer CTE.

In certain embodiments, the pedestal layer has a greater area over the support than the stamp layer.

In certain embodiments, the pedestal layer is a first pedestal layer and comprising a second pedestal layer between the first pedestal layer and the stamp body.

In certain embodiments, the pedestal layer has a first pedestal layer stiffness and the second pedestal layer has a second pedestal layer stiffness and the second pedestal layer stiffness is less than the first pedestal layer stiffness or wherein the second pedestal layer stiffness is between the first pedestal layer stiffness and the stamp layer stiffness.

In certain embodiments, the second pedestal layer stiffness is greater than the stamp layer stiffness.

In certain embodiments, the thickness of the second pedestal layer is less than or substantially equal to the thickness of the first pedestal layer.

In certain embodiments, the first pedestal layer has a first pedestal layer CTE and the second pedestal layer has a second pedestal layer CTE and wherein the second pedestal layer CTE is substantially equal to the first pedestal layer CTE or wherein the second pedestal layer CTE has a value between the stamp layer CTE and the first pedestal layer CTE.

In certain embodiments, the first pedestal layer has a first area over the support, the second pedestal has a second area over the support, the stamp layer body has a third area over the support, and wherein the second area is less than the first area, the third area is less than the second area, or the second area is less than the first area and the third area is less than the second area.

In certain embodiments, the second pedestal layer incorporates less mechanical stress than the first pedestal layer.

In certain embodiments, the stamp layer incorporates less mechanical stress than the pedestal layer.

In certain embodiments, the pedestal layer is flat, has a stacked structure, or has a stacked structure of concentric cylinders or rectangular solids.

In certain embodiments, the support has a roughened surface.

In another aspect, the disclosed technology includes method of making a stamp for micro-transfer printing, including: providing a support having a support stiffness and a support coefficient of thermal expansion (CTE); forming a liquid pedestal layer on the support and curing the liquid pedestal layer to form a cured pedestal layer, the pedestal layer having a pedestal layer stiffness that is less than the support stiffness and a pedestal layer coefficient of thermal expansion (CTE) that is different from the support CTE; and forming a liquid stamp layer on the cured pedestal layer and curing the liquid stamp layer to form a cured stamp layer, the stamp layer having a body and one or more protrusions extending from the body in a direction away from the pedestal layer, the stamp layer having a stamp layer stiffness that is less than the support stiffness and a stamp layer coefficient of thermal expansion (CTE) that is different from the support coefficient of thermal expansion (CTE).

In certain embodiments, the method includes curing the pedestal layer with a different process than curing the stamp layer, curing the pedestal layer at a different temperature than the stamp layer, or curing the pedestal layer at a different rate than the stamp layer.

In certain embodiments, the method includes forming a liquid second pedestal layer and curing the liquid second pedestal layer to form a cured second pedestal layer.

In certain embodiments, the pedestal layer is a first pedestal layer that is cured with a first pedestal layer process and comprising curing the second pedestal layer with a different process than the first pedestal layer process, curing the first pedestal layer at a different temperature than the second pedestal layer, or curing the first pedestal layer at a different rate than the second pedestal layer.

In certain embodiments, the method includes roughening the surface of the support.

In another aspect, the disclosed technology includes a stamp for micro-transfer printing, including: a support; and a stamp layer formed on the support or on one or more layers formed on the support, the stamp layer having a body and one or more protrusions extending from the body in a direction away from the support for a distance from the support, wherein the difference between an actual extent and a predetermined desired extent of a portion of the stamp layer is less than 30 µm per 50 mm, less than or equal to 20 µm per 50 mm, less than or equal to 15 µm per 50 mm, less than or equal to 10 µm per 50 mm, less than or equal to 7.5 µm per 50 mm, or less than or equal to 5 µm per 50 mm.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 3 is a cross section of an alternative micro-transfer printing stamp according to an embodiment of the present invention;

FIG. 4 is a cross section illustrating a stamp surface contour; and

Figure 1A:
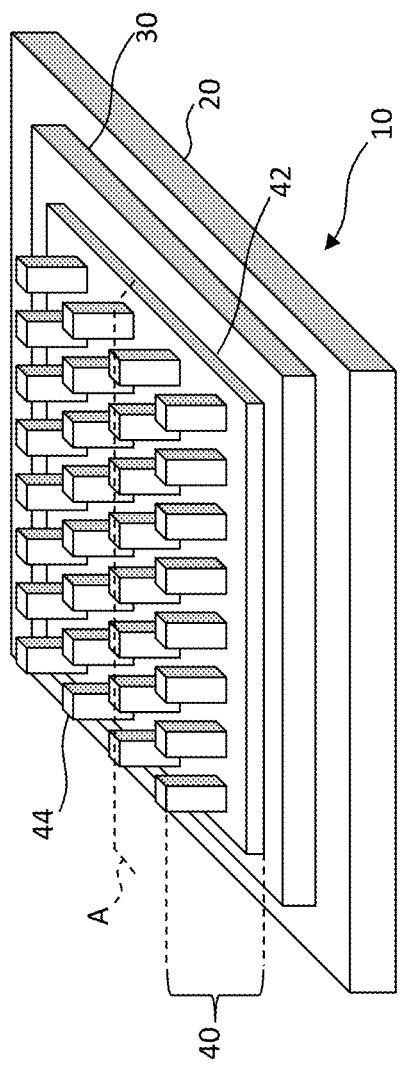
FIG. 1A is a perspective of a micro-transfer printing stamp according to an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not drawn to scale since the variation in size of various elements in the Figures is too great to permit depiction to scale.

DETAILED DESCRIPTION OF THE INVENTION

The present invention provides a stamp and methods of making the stamp for micro-transfer printing micro-transfer printable devices. The micro-transfer printable devices can be light emitters or integrated circuits, for example CMOS integrated circuits made on or in a silicon semiconductor wafer, light-emitting diodes (LEDs), for example made on or in a GaN semiconductor material, or silicon photodiodes. The wafers can have a diameter, for example, greater than or equal to 10 cm, 15 cm, 20 cm, 25 cm, 30 cm, 40 cm, 100 cm, or even larger. The micro-transfer printable devices can have, for example, a width from 1-8 μm, a length from 5-10 μm, or a height from 0.5-3 μm. More generally, the micro-transfer printable devices can include or be a variety of chiplets having conductor or semiconductor structures, including a diode, a light-emitting diode (LED), a transistor, a laser, active electrical components, passive electrical components, or an electrical jumper.

Chiplets are small integrated circuits, can be unpackaged dies released from a source wafer, and can be micro-transfer printed. Chiplets, for example, can have at least one of a width, length, and height from 2 to 5 μm, 5 to 10 μm, 10 to 20 μm, 20 to 50 μm, 50 μm to 100 μm, 100 μm to 250 μm, 250 μm to 500 μm, or 500 μm to 1000 μm. Chiplets, for example, can have a doped or undoped semiconductor substrate thickness of 2 to 5 μm, 5 to 10 μm, 10 to 20 μm, or 20 to 50 μm. The chiplet or micro-transfer printable devices can be micro-light-emitting diodes with a length greater than width, for example having an aspect ratio greater than or equal to 2, 4, 8, 10, 20, or 50 and component contact pads that are adjacent to the ends of the micro-transfer-printable devices along the length of the micro-transfer-printable devices.

Figure 1B:
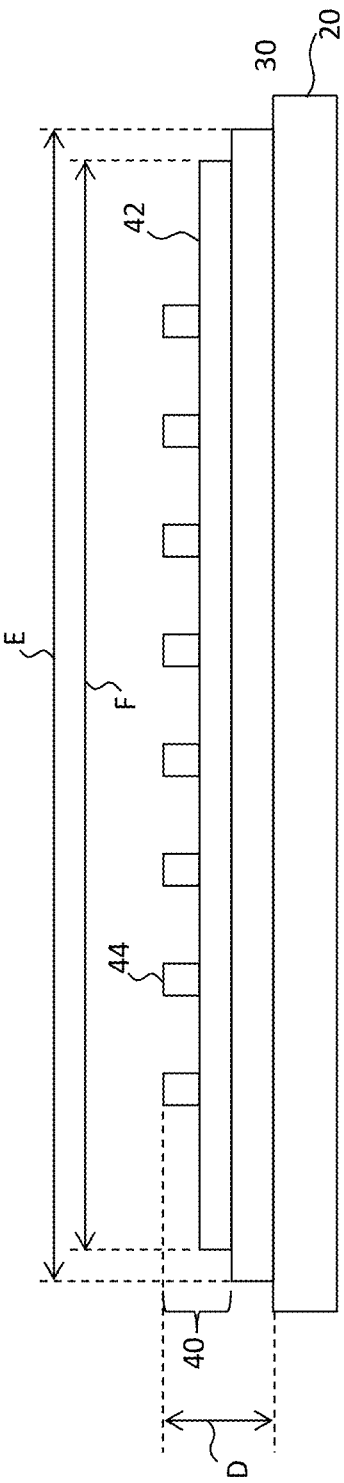
FIG. 1B is a cross section of the micro-transfer printing stamp of FIG. 1A taken along the cross section line A.

Referring to the perspective of FIG. 1A and the cross section of FIG. 1B corresponding to the cross section line A of FIG. 1A, according to an embodiment of the present invention a stamp 10 for micro-transfer printing includes a support 20 having a support stiffness and a support coefficient of thermal expansion (support CTE). A pedestal layer 30 is formed on the support 10. The pedestal layer 30 has a pedestal layer stiffness that is less than the support stiffness and a pedestal layer coefficient of thermal expansion (pedestal layer CTE) that is different from the support CTE. A stamp layer 40 is formed on the pedestal layer 30. The stamp layer 40 has a body 42 and one or more protrusions 44 (e.g., posts) extending from the body 42 in a direction away from the pedestal layer 30. The posts 44, for example, can have an aspect ratio (height-to-width) from 1:4 to 4:1. The posts 44 can have a size that is larger or smaller than the size of a chiplet. Additionally, the posts 44 can have a shape that is different than the shape of a chiplet that is picked up by the stamp. For example, in an embodiment a circular post is used to pick up an 85 μm square chiplet. In another embodiment, for example, a 60 μm square post is used to pick up an 85 μm square chiplet. The stamp layer 40 has a stamp layer stiffness that is less than the support stiffness and a stamp layer coefficient of thermal expansion (stamp layer CTE) that is different from the support CTE. The CTE can be either a linear CTE or a volumetric CTE.

In an embodiment, the pedestal layer 30 is made of the same material in the same proportions as the stamp layer 40 and has the same stiffness and CTE. Alternatively, the pedestal layer 30 includes the same material as the stamp layer 40 but in different proportions, or includes different materials. Using the same materials in different proportions in the pedestal layer 30 and the stamp layer 40 enables the stiffness and CTEs of the different layers to be separately controlled. For example, in an embodiment the pedestal layer 30 is stiffer than the stamp layer 40 or has a smaller CTE than the stamp layer 40.

The pedestal layer 30 or the stamp layer 40 of the present invention can be made of conformal materials such as an elastomer, for example polydimethylsiloxane (PDMS), an optically clear polymeric organosilicon compound. The stiffness and CTE of PDMS can be controlled by providing different quantities of PDMS with an additive, such as Dow Sylgard 184 Elastomer Base and Curing Agent by Dow Corning Corporation of Auburn, Mich., that is mixed at a ratio from 1 part elastomer base to 1 part curing agent by weight to 50 parts elastomer base to 1 part curing agent by weight (e.g., 10 parts elastomer base to 1 part curing agent by weight) to provide PDMS with varying stiffness and CTE. In various embodiments, the pedestal layer 30 can have a range of thickness from 100 μm to 10 mm, the stamp layer can have a range of thickness from 0.1 mm to 10 mm (e.g., 1 mm), and the stamp body 42 can have a range of thicknesses from 0.50 μm to 1000 μm (e.g., 200 μm). The stamp posts 44 can have a length ranging from 5 μm to 100 μm (e.g., 20 μm), and a height-to-width ratio of 1:4 to 4:1 or more. The linear pedestal layer CTE or the linear stamp layer CTE can be from $1\times10^{-4}/°$ K to $5\times10^{-4}/°$ K (e.g., approximately $3.1 \times 10^{-4}$/° K). These ranges and values are illustrative and not limiting and other materials and sizes can be included in the present invention.

The support can be glass (e.g., a portion of a flat-panel display substrate), soda-lime glass, borosilicate glass, pyrex, metal, ceramic, polymer, or a semiconductor (e.g., a wafer or portion of a wafer). The support can have a thickness ranging from 0.5 mm to 10 mm. These ranges are illustrative and not limiting and other materials and sizes can be included in the present invention. The linear support CTE can be from $5 \times 10^{-6}$/° K to $10 \times 10^{-6}$/° K (e.g., approximately $8.5 \times 10^{-6}$/° K).

Referring to FIG. 4, large supports 20 can have a variable thickness over the extent of the support and material coatings over the extent of the support can likewise have a variable thickness. This variability is exacerbated by the process generally employed to make elastomeric stamps. In a typical process, a support is placed in a mold structure with a mold defining the desired stamp structure shapes and locations, such as the posts. A liquid elastomer (such as PDMS) is injected into the mold and then heated to cure the liquid and form the stamp. The stamp is then cooled and can be used for micro-transfer printing. However, because the support 20 has a different CTE than the cured elastomer stamp layer 40, as the stamp cools, the support 20 and stamp layer 40 physically shrink at different rates and in different amounts, creating stress in and distortion of the stamp structure. Because the stamp layer 40 is elastic and is typically less rigid or stiff than the support 20, the stress results primarily in deformation of the stamp layer 40. This can form crowns 46 at the edges of the stamp layer 40 and creating variability in the stamp layer thickness or distribution or shapes of structures, such as variation in the thickness of the stamp layer 40 across the extent of the support 20. This is illustrated in FIG. 4 as a surface of the stamp body 42 at a non-zero angle 48 relative to a surface of the support 20 (e.g., not parallel to the surface of the support 20). This variability in the stamp layer 40 produces a corresponding variability in the distance of the distal ends of the stamp posts 44 from the support 20. When the stamp is used to pick up components from a flat surface such as a semiconductor substrate, some of the posts 44 will press too hard against some of the components and some of the posts 44 will not press sufficiently hard against other components or possibly will not contact the components at all, resulting in a failure to pick up and transfer the desired components in a micro-transfer printing operation.

Furthermore, the extent and location of the stamp structures (such as posts 44) over the extent of the support 20 is distorted. Because of the CTE mismatch, the overall size of the stamp layer 40 on the support 20 is different in a cooled state than when cured. This distortion results in a different distribution of the posts 44 over the support 20, for example the posts 44 can be further apart (or closer) than is desired, resulting in run-out. For example, if the total linear distortion of the stamp layer 40 with respect to the support 20 measured over the width of the stamp layer 40 is 10 microns and if the stamp has 100 posts 44 equally distributed over the width of the stamp layer 40, then each post 44 is misaligned by 0.1 microns with respect to its neighbors in the linear direction. However, this misalignment is additive, so that while the first post 44 is only misaligned by 0.1 microns from an edge, perhaps a negligible amount, the $100^{th}$ post 44 is misaligned by 10 microns from the opposite edge, a significant amount. A run-out of 10 microns for a conventional stamp has been measured. Thus, embodiments of the present invention can decrease such run-out.

It has also been observed that the use of a pedestal layer 30 enables thinner stamp layers 40, especially a thinner stamp body 42 that in turn can reduce distortion, for example due to differential curing rates between various portions of the stamp layer 40.

These problems become increasingly problematic as the size of the stamp increases and the expansion and contraction of the different stamp layers increases due to the heating and cooling of the stamp layers during the curing process. Large stamps are desirable because greater quantities of components can be transferred in a single micro-transfer printing operation with larger stamps, reducing transfer costs. Thus, stamps of the prior art can be limited in their size or the number of components it can reliably pick up or transfer.

According to embodiments of the present invention, this problem is mitigated by providing one or more pedestal layer(s) 30 between the support 20 and the stamp layer 40. The pedestal layer(s) 30 can be made using the same process as is used to make the stamp layer 40, except that the mold for the pedestal layer 30 need not be structured (i.e., has no posts 44) and can be flat. In certain embodiments the pedestal layer 30 is substantially flat or does not include micro-structures (e.g., posts 44) for picking up material from a source substrate. In other embodiments, the pedestal layer 30 is flat at least in the region in which the stamp layer 40 is formed or can have a stacked structure, for example a stack structure of concentric cylinders or rectangular solids of the same or different thicknesses.

As discussed above, the pedestal layer 30 can be undesirably deformed due to the mismatch in CTE between the support 20 material (e.g. glass) and the pedestal layer 30 material (e.g. PDMS). However, in an embodiment of the present invention, the stamp layer 40 formed on the pedestal layer 30 has a reduced CTE mismatch (or none at all). Because the stamp layer 40 is formed using a liquid, the liquid covers the deformed surface of the pedestal layer to form a flat layer at least in region in which the stamp layer is to be formed. During the curing process, the stamp layer 40 will encounter thermal stress but this stress is produced in both the pedestal layer 30 and the stamp layer 40 and the resulting stress in the stamp layer 40 is reduced because of the presence of the pedestal layer 30. The stamp layer 40 therefore experiences less stress during the curing process and deformation of the stamp layer 40 is reduced. Thus, the stamp layer 40 is more relaxed (i.e., has less internal stress) than the pedestal layer 30, resulting in a flatter stamp 10 with structures such as posts that are better aligned in a plane and is more suitable for reliable micro-transfer printing.

In various embodiments of the present invention, the stamp body 42 and the pedestal layer 30 can have different attributes. In one embodiment, the pedestal layer stiffness is greater than the stamp layer stiffness or the pedestal layer stiffness is between the stamp layer stiffness and the support stiffness. By providing different layers with different stiffness in the stamp 10, the deformation in the different layers of the stamp 10 can be controlled and the deformation of the stamp layer 40 reduced.

Alternatively, the pedestal layer stiffness is less than or substantially equal to the stamp layer stiffness. In another embodiment, the thickness of the pedestal layer 30 is greater than the thickness of the stamp layer body 42 or the thickness of the pedestal layer 30 is less than or substantially equal to the thickness of the stamp layer body 42. By providing different layers with different thickness in the stamp 10, the deformation in the different layers of the stamp 10 can be controlled and the deformation of the stamp layer 40 reduced.

In other embodiments, the pedestal layer CTE is greater than the stamp layer CTE or the pedestal layer CTE is between the stamp layer CTE and the support layer CTE. Alternatively, the pedestal layer CTE is less than or substantially equal to the stamp layer CTE. By providing different layers with different CTEs in the stamp 10, the deformation in the different layers of the stamp 10 can be controlled and the deformation of the stamp layer 40 reduced.

Referring back to FIG. 1B, in certain embodiments, the pedestal layer 30 extends over the support 20 to a first extent E and the stamp layer body 42 extends over the support 20 to a second extent F that is smaller than or equal to the first extent. The extent can be an edge, for example, an edge of a rectangle as shown, a diagonal of opposing corners of a rectangle, a diameter of a circle, or a major or minor axis of an ellipse. The pedestal layer 30 therefore has a greater area over the support 20 than does the stamp layer 40. By providing different layers with different areas in the stamp 10, the deformation in the different layers of the stamp 10 can be controlled and the deformation of the stamp layer 40 reduced.

Thus, in embodiments of the present invention, relatively larger stamps 10 are provided with relatively flatter surfaces. For example, a stamp 10 for micro-transfer printing can include a support 20 and a stamp layer 40 formed on the support 20 or on one or more layers (e.g., pedestal layer 30) formed on the support 20. The stamp layer 40 has a body 42 and one or more protrusions 44 extending from the body 42 in a direction away from the support 20 for a distance D from the support 20. The stamp layer 40 extends over the support for an extent F. A ratio of the difference between the distance D and a predetermined desired distance and the extent is less than 30 µm in 50 mm, less than or equal to 20 µm in 50 mm, less than or equal to 15 µm in 50 mm, less than or equal to 10 µm in 50 mm, less than or equal to 7.5 µm in 50 mm, or less than or equal to 5 µm in 50 mm. The predetermined desired distance is the designed distance (e.g., the designed height of the posts from the support 20) and D is the actual distance. Thus the difference between the distance D and the predetermined desired distance is the error due to manufacturing tolerances and processes, such as deformation in layers such as the stamp layer 44 due to the curing process. The ratio is a metric combining the size of the stamp 10 (defined here as a linear extent of the stamp layer 40 over the support 20 in any direction rather than an area) and the error is desirably small. For example, the ratio can be $30\times10^{-6}$ m/$50\times10^{-3}$ m=$6\times10^{-4}$ or less or $5\times10^{-6}$ m/$50\times10^{-3}$ m=$1\times10^{-4}$ or less.

Figure 2A:
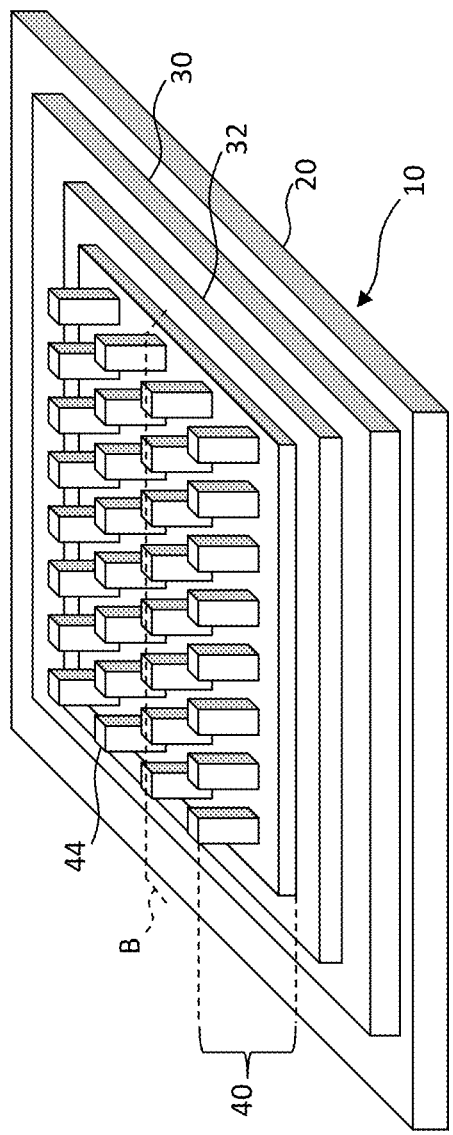
FIG. 2A is a perspective of another micro-transfer printing stamp according to another embodiment of the present invention.
Figure 2B:
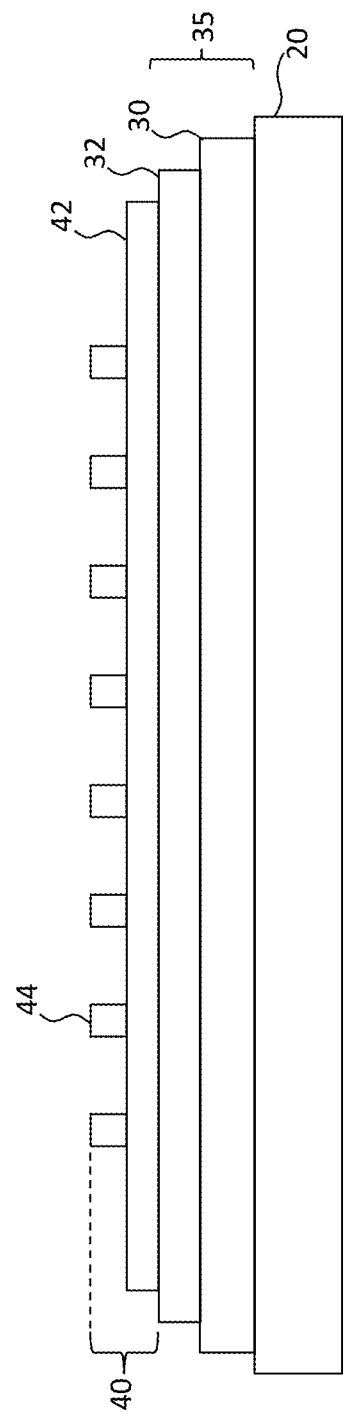
FIG. 2B is a cross section of the micro-transfer printing stamp of FIG. 2A taken along the cross section line B.

Referring to the perspective of FIG. 2A and the cross section of FIG. 2B taken along cross section line B of FIG. 2A, in another embodiment of the present invention the pedestal layer 30 is a first pedestal layer 30 and a second pedestal layer 32 is formed between the first pedestal layer 30 and the stamp body 42. The second pedestal layer 32 serves the same stress-absorbing and stress reducing function as the first pedestal layer 30 and therefore the second pedestal layer 32 can be more relaxed and have less internal stress than the first pedestal layer 30, thus providing a further reduction in stress to the stamp layer 40. The second pedestal layer 32 can be made of the same materials and using the same process as the first pedestal layer 30, and can have the same thickness, CTE, and stiffness. Alternatively, the second pedestal layer 32 can have the same materials in different proportions as the first pedestal layer 30, or include different materials than the first pedestal layer 30. In other embodiments, the second pedestal layer stiffness is less than the first pedestal layer stiffness or the second pedestal layer stiffness is between the first pedestal layer stiffness and the stamp layer stiffness. In another embodiment, the second pedestal layer stiffness is greater than the stamp layer stiffness. Similarly, the thickness of the second pedestal layer 32 can be less than or substantially equal to the thickness of the first pedestal layer 30. Likewise, the second pedestal layer CTE can be substantially equal to the first pedestal layer CTE or the second pedestal layer CTE can have a value between the stamp layer CTE and the first pedestal layer CTE.

As is also shown in FIGS. 2A and 2B, the first pedestal layer 30 extends over the support 20 to a first extent, the second pedestal layer 32 extends over the support 20 to a second extent, and the stamp layer body 42 extends over the support 20 to a third extent. The second extent is less than the first extent, the third extent is less than the second extent, or the second extent is less than the first extent and the third extent is less than the second extent. Thus, the first pedestal layer 30 has a first area over the support 20, the second pedestal 32 has a second area over the support 20, the stamp layer body 42 has a third area over the support 20, and the second area is less than the first area, the third area is less than the second area, or the second area is less than the first area and the third area is less than the second area. FIG. 3 illustrates the alternative embodiment in which the areas of the first pedestal layer 30, the second pedestal layer 32, and the stamp body 42 have the same extent, area, and thickness.

In general, in embodiments of the present invention it can be desirable but not necessary for the attributes of the layers in the stamp 10 to monotonically change from those of the support 20 to those of the stamp layer 40. Any number of pedestal layers (collectively pedestal layers 35) can be provided between the support 20 and the stamp layer 40 and the attributes of the pedestal layers 35 physically closer to the support 20 (e.g., first pedestal layer 30) should have values closer to the attributes of the support 20 than to the attributes of the pedestal layers 30 farther from the support 20 (e.g., second pedestal layer 32). Similarly, the attributes of the pedestal layers 30 physically closer to the stamp layer 40 (e.g., second pedestal layer 32) should have values closer to the attributes of the stamp layer 40 than to the attributes of the pedestal layers 30 farther from the stamp layer 40 (e.g., first pedestal layer 30). Alternatively, the attributes of the different pedestal layers 30 can be substantially the same and the materials and processes used to form them are likewise substantially the same.

In an embodiment, the support 20 can have a roughened surface, for example provided by sand blasting, exposure to abrasives, or exposure to a plasma or other energetic particles.

In FIGS. 1A, 1B, 2A, 2B, 3, and 4, differences in size, extent, and thickness are illustrated for clarity of exposition rather than accuracy. In practical applications, the relative or absolute differences in physical sizes can be larger or smaller.

The stamp 10 can be made by providing a mold structure that holds a support 20 in alignment with a stamp mold. The stamp mold can provide a body cavity and one or more structured cavities (e.g., defining posts 44). In the case of the pedestal layer, the cavity has an unstructured flat surface. The liquid curable material is injected into the mold cavity and the assembly is subjected to heat to cure the liquid curable material to form the layer corresponding to the mold. The mold is removed from the mold structure and the stamp 10 removed from the mold.

Figure 5:
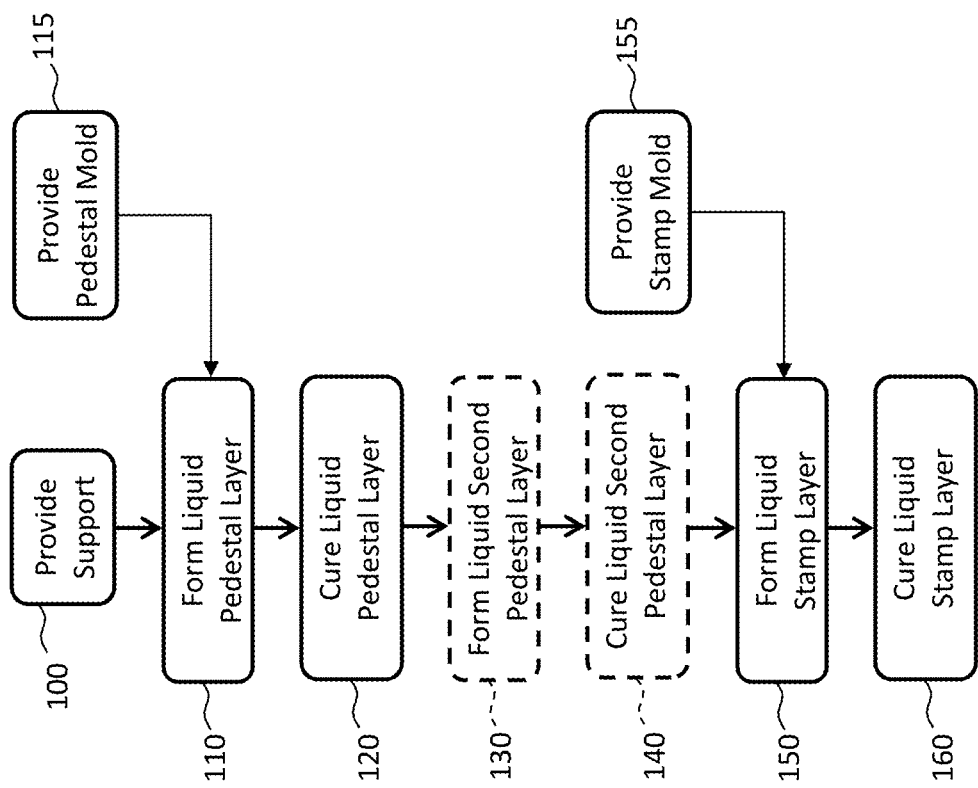
FIG. 5 is a flow diagram illustrating methods in accordance with embodiments of the present invention.

Referring to FIG. 5, in an embodiment of the present invention, a method of making a stamp 10 for micro-transfer printing includes providing a support 20 having a support stiffness and a support coefficient of thermal expansion (CTE) in step 100 and providing a pedestal mold in step 115. A liquid pedestal layer is formed on the support 20 in the pedestal mold in step 110 and cured in step 120 to form a cured pedestal layer 30. The pedestal layer 30 has a pedestal layer stiffness that is less than the support stiffness and a pedestal layer coefficient of thermal expansion (CTE) that is different from the support CTE. The pedestal mold is removed. Optionally, the process is repeated by forming a liquid second pedestal layer using the pedestal mold again in optional step 130 and cured in optional step 140 to form the second pedestal layer 32. A stamp mold is provided in step 155 and a liquid stamp layer is formed on the cured pedestal layer 30 (or optionally the cured second pedestal layer 32) with the stamp mold in step 150 and cured in step 160 to form a cured stamp layer 40. The stamp layer 40 has a body 42 and one or more protrusions 44 (e.g., posts) extending from the body 42 in a direction away from the pedestal layer 30 defined by the stamp mold. The stamp layer 40 has a stamp layer stiffness that is less than the support stiffness and a stamp layer coefficient of thermal expansion (CTE) that is different from the support CTE.

In various embodiments of the present invention, the pedestal layer 30 is cured with a different process than the stamp layer 40, for example the pedestal layer 30 is cured at a different temperature than the stamp layer 40, or the pedestal layer 30 is cured at a different rate than the stamp layer 40. Similarly, if the stamp 10 includes a second pedestal layer 32, the second pedestal layer 32 can be cured with a different process than either of the first pedestal layer 30 or the stamp layer 40. For example, the second pedestal layer 32 can be cured at a different temperature or at a different rate than either the pedestal layer (first pedestal layer) 30 or the stamp layer 40. In a further embodiment, the surface of the support 20 is roughened, for example by using energetic particles, such as abrasive particles, plasma, or high-energy particles.

Figure 6A:
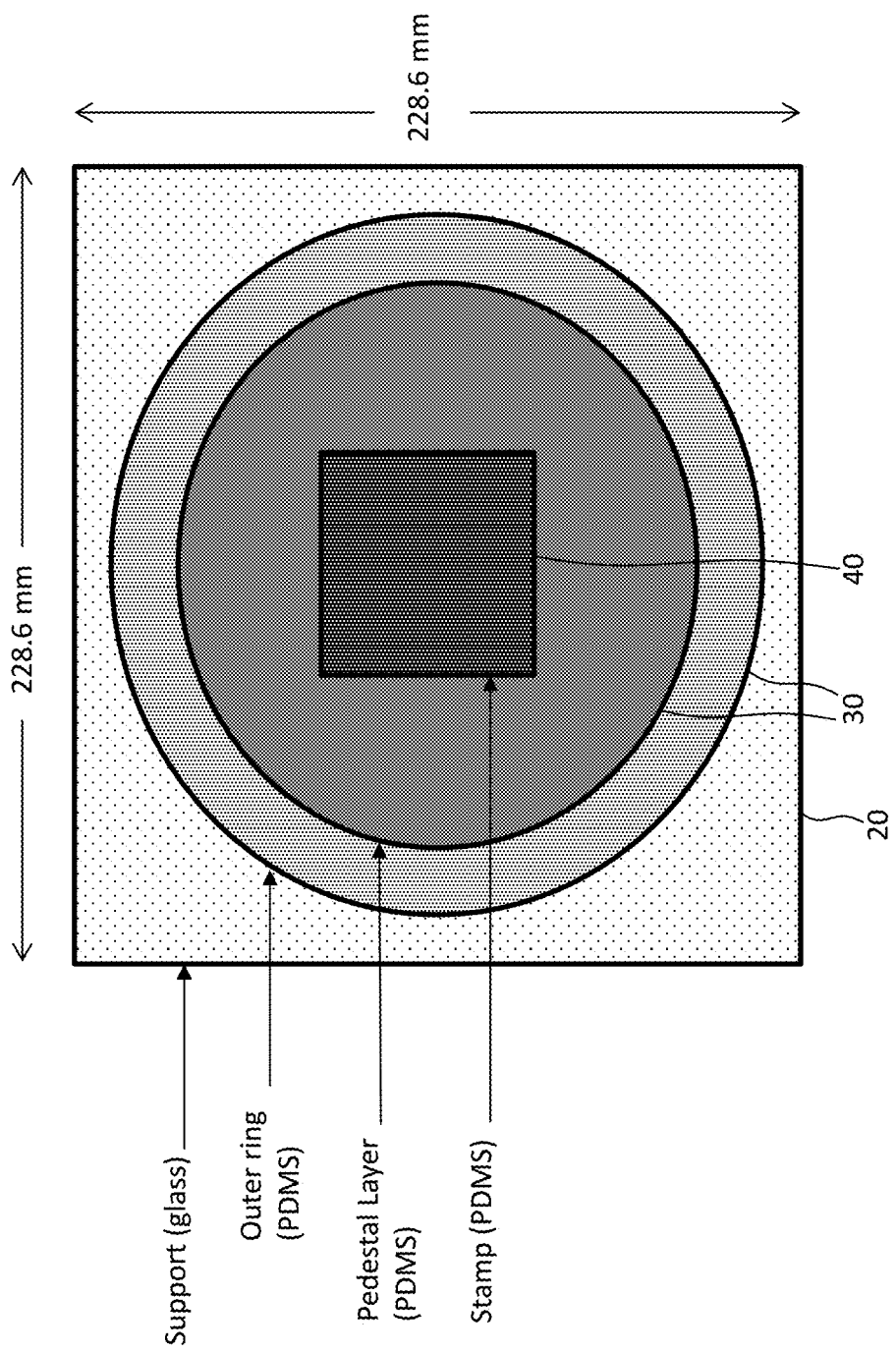
FIG. 6A is a plan view illustration of a stamp structure according to an embodiment of the present invention.
Figure 6B:
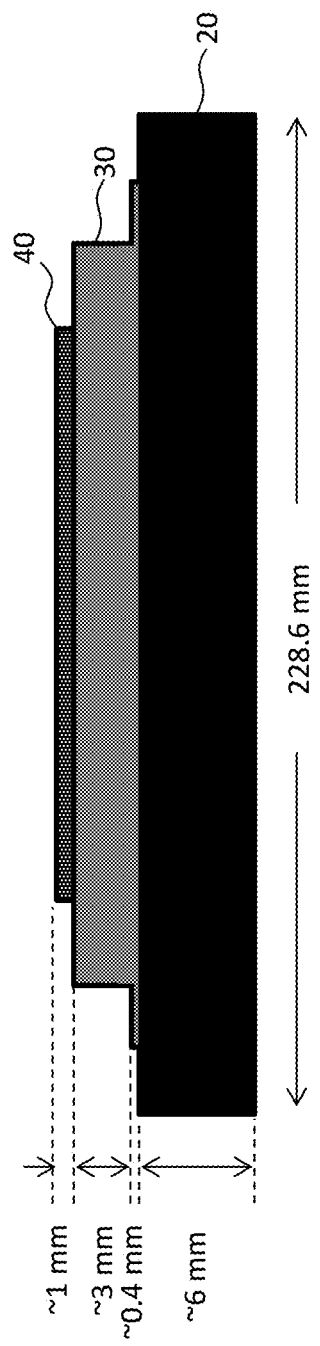
FIG. 6B is a cross section of the illustration of FIG. 6A.

Referring to FIG. 6, an embodiment of the present invention has been constructed using the method described. In this example, a square glass wafer support 20 with an edge length of 228.6 mm and a thickness of 6 mm and a pedestal mold defining a circle with a 165.1 mm diameter and a depth of approximately 3 mm (formed with a treated blank silicon wafer) were inserted into a mold structure. A blank silicon wafer that has been treated to allow for release of the polymer from the mold provides a low cost, very flat substrate forming a mold surface. Because of the mold structure an additional outer ring with a 215.9 mm diameter and 0.4 mm depth of PDMS is formed in the same steps as the pedestal layer 30. The outer ring can be considered to be an additional pedestal or a portion of the pedestal layer 30. Liquid PDMS including 91% PDMS and 9% additive by weight was mixed at room temperature and forced into the first pedestal mold under 25 psi pressure until it was full. The mold structure was placed into an oven at 60° C. for 240 minutes or more to cure the pedestal layer 30 and outer ring on the support 20. The pedestal mold was removed from the mold structure and replaced with a stamp mold defining a rectangular stamp layer 40 with an edge size of 50.8 mm and a depth of approximately 1 mm. The same mixture of liquid PDMS was forced into the stamp mold at the same pressure and cured in an oven using the same process to cure the stamp layer 44 on the first pedestal layer 30. The stamp 10 was removed from the stamp mold and mold structure.

A control stamp of the same size was made under the same conditions as the stamp 10 but without the pedestal layer 30. Because of the mold structure an additional outer ring with a 215.9 mm diameter and 0.4 mm depth of PDMS is formed in the same steps as the stamp layer 40 and the outer ring was cured with the stamp layer 40 in a common step. Using optical metrology, the control stamp layer 40 was found to have an average height variation of 30 μm from one edge of the control stamp layer 40 to an opposite edge. The inventive stamps 10 incorporating the pedestal layer 30 were measured using the same procedure and found to have a corresponding variation of 14-17 μm, demonstrating a significantly improved stamp flatness.

Figure 7:
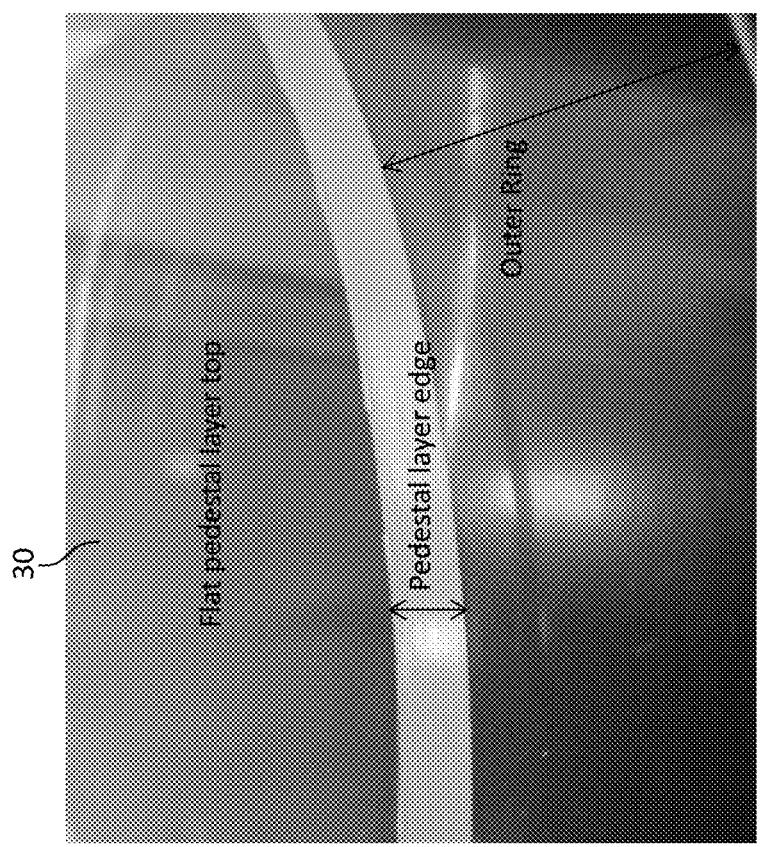
FIG. 7 is a micrograph of a support and pedestal layer viewed at an angle according to an embodiment of the present invention.
Figure 8:
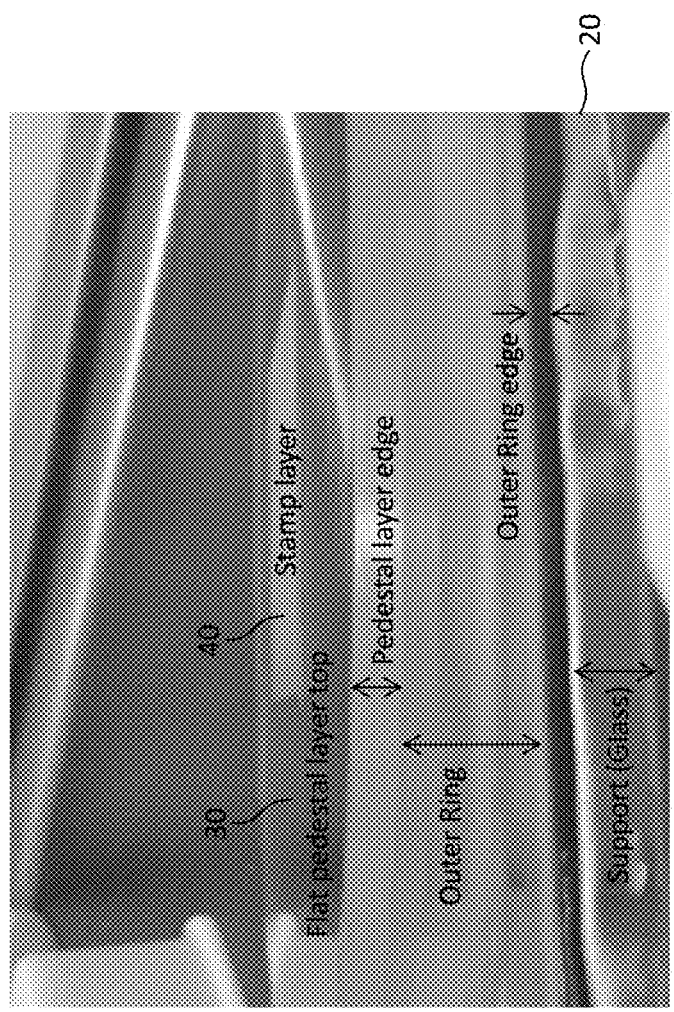
FIG. 8 is a micrograph of a support, pedestal layer, and stamp layer viewed at an angle according to an embodiment of the present invention.
Figure 9:
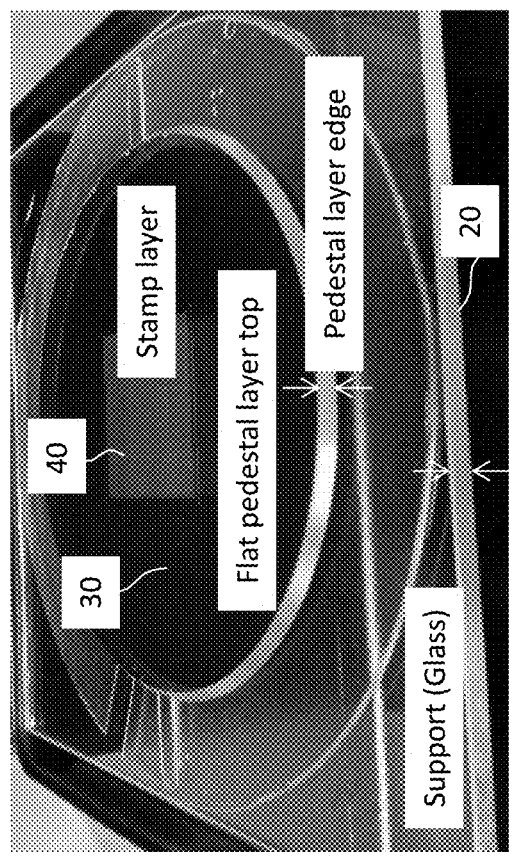
FIG. 9 is a micrograph of a support, pedestal layer, and stamp layer viewed at an angle and at a larger scale than FIG. 8 according to an embodiment of the present invention.

FIG. 6 is a micrograph of a stamp including the pedestal layer 30 without the stamp layer 44 and FIG. 7 is a corresponding micrograph of the stamp 10 with the stamp layer 44.

A method of using the stamp 10 includes providing the stamp 10, providing a destination substrate (e.g., a display substrate), and providing a micro-transfer printable device in or on a source substrate (e.g., a source wafer). The stamp 10 is aligned with the source wafer and the micro-transfer printable devices are contacted with the stamp posts 44. The surfaces at the distal end of one or more of the posts 44 are pressed against the micro-transfer printable devices to adhere the micro-transfer printable devices to the distal end of the posts 44. The stamp 10 is removed from the wafer to micro-transfer the printable devices from the wafer with the stamp 10. The micro-transfer printable devices are then pressed against a destination substrate with the stamp 10 to adhere the micro-transfer printable devices to the destination substrate. The stamp 10 is removed from the micro-transfer printable devices and the destination substrate.

In an alternative method of making an improved stamp, a stamp support 20 is cleaned, for example with de-ionized hot water to remove oil and dirt and then with hydroxide, in a clean room. The stamp support 20 can have a thickness, for example, of one mm. A stamp is cured on a support 20 and then carefully removed. A rim (for example a circular rim or a rim having any closed curve shape) is also formed, for example with PDMS on another support, and then carefully removed and applied to the stamp support disposed on a flat surface orthogonal to the force of gravity. An evaporable liquid, for example a water-based liquid such as de-ionized water, is placed on the stamp support 20 to form a pool within the rim at room temperature. The pool provides a water bed on which the cured stamp is gently placed, for example by bending the stamp by the edges so that a center line of the stamp first contacts the water and then the surface of the (back side) of the body 42 of the stamp from the center line to the edge contacts the water as the stamp is gently laid on the water bed so that it gently floats on the surface of the water bed within the bounds of the rim. The water is then allowed to evaporate at room temperature, for example overnight. The rim is removed. The support 20 and stamp are optionally placed in a vacuum or low-pressure environment to remove any trapped gases (e.g. atmospheric gases). Since the stamp is removed from the surface on which it is formed, it can relax. The relaxed state is maintained on the water bed and as the water evaporates at room temperature. Thus, the CTE mismatch between the supports and the stamp no longer creates, or at least reduces, stress within the stamp. A stamp using de-ionized water for the water-bed process has been made and measured, demonstrating reduced distortion of about 7%.

Thus, in a method of the present invention a stamp support 20, a rim, and a flexible stamp are provided. The rim is disposed on a surface of the stamp support 20 and an evaporable liquid disposed on the surface within the rim, forming a pool. The flexible stamp is disposed on the pool and the liquid allowed to evaporate. The rim is optionally removed to provide a stamp including the stamp support 20 and the flexible stamp.

A micro-transfer printable device can be an active component, for example including one or more active elements such as electronic transistors or diodes, light-emitting diodes, or photodiodes that produce an electrical current in response to ambient light. Alternatively, the micro-transfer printable device can be a passive component, for example including one or more passive elements such as resistors, capacitors, or conductors. In another embodiment, the micro-transfer printable device is a compound micro-transfer printable device that includes both active and passive elements. The micro-transfer printable device can be a semiconductor device having one or more semiconductor layers, such as an integrated circuit or chiplet. The micro-transfer printable device can be an unpackaged die. In yet another embodiment, the micro-transfer printable device is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro-transfer printed itself after the elements have been arranged and interconnected thereon. The micro-transfer printable devices can be electronic processors, controllers, drivers, light-emitting diodes, photodiodes, light-control devices, or light-management devices.

The micro-transfer printable devices can include active elements such as electronic circuits formed using lithographic processes and can include passive elements such as electrical connections, e.g., wires. In some embodiments of the present invention, the micro-transfer printable devices are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet printable component structures can be made in a source semiconductor wafer (e.g., a silicon or GaN wafer) having a process side and a back side used to handle and transport the wafer. Micro-transfer printable devices are formed using lithographic processes in an active layer on or in the process side of the source wafer. An empty release layer space is formed beneath the micro-transfer printable devices with tethers connecting the micro-transfer printable devices to the source wafer in such a way that pressure applied against the micro-transfer printable devices breaks the tethers to release the micro-transfer printable devices from the source wafer (e.g., with the stamp). Methods of forming such structures are described, for example, in Cok et al., *AMOLED Displays using Transfer-Printed Integrated Circuits, Society for Information Display*, Vol. 40, Issue 1, pp. 947-950, and U.S. Pat. No. 8,889,485, entitled Methods of Surface Attachment of Flipped Active Components, issued Nov. 18, 2014.

According to various embodiments of the present invention, the native source wafer can be provided with the micro-transfer printable device, release layer, and tethers already formed, or they can be constructed as part of the process of the present invention.

The source wafer and micro-transfer printable devices, stamp 10, and destination substrate can be made separately and at different times or in different temporal orders or locations and provided in various process states.

The method of the present invention can be iteratively applied to a single or multiple destination substrates. By repeatedly transferring sub-arrays of micro-transfer printable devices from a source wafer to a destination substrate with a stamp 10 and relatively moving the stamp 10 and destination substrate between stamping operations by a distance equal to the spacing of the selected micro-transfer printable devices in the transferred sub-array between each transfer of micro-transfer printable devices, an array of micro-transfer printable devices formed at a high density on a source wafer can be transferred to a destination substrate at a much lower density. In practice, the source wafer is likely to be expensive, and forming micro-transfer printable devices with a high density on the source wafer will reduce the cost of the micro-transfer printable devices, especially as compared to forming components on the destination substrate. Transferring the micro-transfer printable devices to a lower-density destination substrate can be used, for example, if the micro-transfer printable devices manage elements distributed over the destination substrate, for example in a display, digital radiographic plate, or photovoltaic system.

In particular, in the case wherein the active micro-transfer printable device is an integrated circuit formed in a crystalline semiconductor material, the integrated circuit substrate provides sufficient cohesion, strength, and flexibility that it can adhere to the destination substrate without breaking as the transfer stamp 10 is removed.

In comparison to thin-film manufacturing methods, using densely populated source substrates wafers and transferring micro-transfer printable devices to a destination substrate that requires only a sparse array of micro-transfer printable devices located thereon does not waste or require active layer material on a destination substrate. The present invention can also be used in transferring micro-transfer printable devices made with crystalline semiconductor materials that have higher performance than thin-film active components. Furthermore, the flatness, smoothness, chemical stability, and heat stability requirements for a destination substrate used in embodiments of the present invention may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
B cross section line
D distance
E extent
F extent
10 stamp
20 support
30 pedestal layer/first pedestal layer
32 second pedestal layer
35 pedestal layers
40 stamp layer
42 body
44 protrusion/post
46 crown
48 angle
100 provide support step
110 form liquid pedestal layer step
115 provide pedestal mold step
120 cure liquid pedestal layer step
130 optional form liquid second pedestal layer step
140 optional cure liquid second pedestal layer step
150 form liquid stamp layer step
155 provide stamp mold step
160 cure liquid stamp layer step

What is claimed:

1. A method of making a stamp for micro-transfer printing, comprising:
providing a support having a support stiffness and a support coefficient of thermal expansion (CTE);
forming a liquid pedestal layer on the support and curing the liquid pedestal layer to form a cured pedestal layer, the pedestal layer having a pedestal layer stiffness that is less than the support stiffness and a pedestal layer coefficient of thermal expansion (CTE) that is different from the support CTE; and
forming a liquid stamp layer on or over the cured pedestal layer and curing the liquid stamp layer to form a cured stamp layer, the stamp layer consisting of a stamp body and a plurality of protrusions extending from the body in a direction away from the pedestal layer, the stamp layer having a stamp layer stiffness that is less than the support stiffness and a stamp layer coefficient of thermal expansion (CTE) that is different from the support coefficient of thermal expansion (CTE),
wherein the pedestal layer has an area over the support that is greater than an area of the stamp layer over the support and the area of the pedestal layer is smaller than an area of the support,
and each of the plurality of protrusions is configured to contact a different printable device and adhere the different printable device to a distal end of the protrusion, respectively.

2. The method of claim 1, comprising curing the pedestal layer with a different process than curing the stamp layer, curing the pedestal layer at a different temperature than the stamp layer, or curing the pedestal layer at a different rate than the stamp layer.

3. The method of claim 1, wherein the pedestal layer and the stamp layer are made of a same material.

4. The method of claim 1, wherein the pedestal layer stiffness is greater than the stamp layer stiffness.

5. The method of claim 1, wherein the pedestal layer stiffness is less than the stamp layer stiffness.

6. The method of claim 1, wherein a thickness of the pedestal layer is greater than a thickness of the stamp body.

7. The method of claim 1, wherein a thickness of the pedestal layer is less than or substantially equal to a thickness of the stamp body.

8. The method of claim 1, wherein the pedestal layer CTE is greater than the stamp layer CTE.

9. The method of claim 1, wherein the pedestal layer CTE is less than or equal to the stamp layer CTE.

10. The method of claim 1, wherein the pedestal layer is a first pedestal layer, the area of the pedestal layer area is a first pedestal layer area, the pedestal layer stiffness is a first pedestal layer stiffness, and the pedestal layer CTE is a first pedestal layer CTE;
the method further comprises (i) forming another liquid pedestal layer on the first pedestal layer (ii) curing the another pedestal layer to form a second pedestal layer that is disposed between the first pedestal layer and the stamp body, the second pedestal layer having a second area over the support smaller than the first pedestal layer area.

11. The method of claim 10, wherein the second pedestal layer has a second pedestal layer stiffness and the second pedestal layer stiffness is less than the first pedestal layer stiffness.

12. The method of claim 10, wherein the second pedestal layer has a second pedestal layer stiffness and the second pedestal layer stiffness is greater than the stamp layer stiffness.

13. The method of claim 10, wherein the second pedestal layer has a second pedestal layer stiffness and the second pedestal layer stiffness is between the first pedestal layer stiffness and the stamp layer stiffness.

14. The method of claim 10, wherein the second pedestal layer has a second pedestal layer CTE and the second pedestal layer CTE has a value between the stamp layer CTE and the first pedestal layer CTE.

15. The method of claim 10, wherein a thickness of the second pedestal layer is less than or substantially equal to a thickness of the first pedestal layer.

16. The method of claim 10, wherein the second pedestal layer has a second pedestal layer CTE, and wherein the second pedestal layer CTE is substantially equal to the first pedestal layer CTE.

17. The method of claim 10, wherein the stamp body has a third area over the support and wherein the third area is less than the second area of the second pedestal layer.

18. The method of claim 1, wherein the pedestal layer is flat, has a stacked structure, or has a stacked structure of concentric cylinders or rectangular solids.

19. The method of claim 1, wherein the pedestal layer and the stamp layer are each made of two or more same materials but proportions of the two or more same materials in the pedestal layer are different from proportions of the two or more same materials in the stamp layer.

20. The method of claim 1, wherein the pedestal layer stiffness is between the stamp layer stiffness and the support stiffness, wherein the pedestal layer CTE is between the stamp layer CTE and the support layer CTE, wherein the pedestal layer and the stamp layer are each formed from a cured elastomer, or wherein the pedestal layer and the stamp layer are each formed from a cured polydimethylsiloxane (PDMS).

\* \* \* \* \*